(12) United States Patent
Van Schie et al.

(10) Patent No.: US 12,025,280 B2
(45) Date of Patent: Jul. 2, 2024

(54) ARTIFICIAL FIREPLACE FOR DISPLAYING AN ARTIFICIAL FIRE PATTERN

(71) Applicant: KAL-FIRE BEHEER B.V., Belfeld (NL)

(72) Inventors: Michael Petrus Van Schie, Rotterdam (NL); Beyko Martijn Eli Van Melick, Belfeld (NL)

(73) Assignee: KAL-FIRE BEHEER B.V., Belfeld (NL)

( * ) Notice: Subject to any disclaimer, the term of this patent is extended or adjusted under 35 U.S.C. 154(b) by 152 days.

(21) Appl. No.: 17/759,903

(22) PCT Filed: Jan. 29, 2021

(86) PCT No.: PCT/EP2021/052088
§ 371 (c)(1),
(2) Date: Aug. 1, 2022

(87) PCT Pub. No.: WO2021/152078
PCT Pub. Date: Aug. 5, 2021

(65) Prior Publication Data
US 2023/0130255 A1   Apr. 27, 2023

(30) Foreign Application Priority Data
Jan. 31, 2020   (NL) ...................................... 2024804

(51) Int. Cl.
*F21S 10/04*   (2006.01)
(52) U.S. Cl.
CPC .................................. *F21S 10/043* (2013.01)

(58) Field of Classification Search
CPC ......... F21S 10/043; F21S 10/04; F24C 7/004; G02B 30/60; G02B 27/14
See application file for complete search history.

(56) References Cited

U.S. PATENT DOCUMENTS

| 5,195,820 | A | 3/1993 | Rehberg |
| 9,176,274 | B2 | 11/2015 | Yoo |
| 9,208,703 | B2 | 12/2015 | Schaeffer |
| 2006/0101681 | A1* | 5/2006 | Hess ..................... F24B 1/1808 40/428 |

(Continued)

FOREIGN PATENT DOCUMENTS

| EP | 2290290 | 3/2011 |
| GB | 2444076 | 5/2008 |

(Continued)

*Primary Examiner* — Gary C Hoge
(74) *Attorney, Agent, or Firm* — Browdy and Neimark, PLLC

(57) ABSTRACT

The present invention relates to a display device for an artificial fireplace, configured to display a fireplace video that at least comprises flames. The display device comprises a backlight source, which comprises a plurality of LEDs, which are disposed in an LED pattern, wherein the backlight source is configured to emit light with the LEDs, and an LCD-panel, which is configured to selectively transmit and/or modulate light from the backlight source, in order to display the fireplace video. An edge of the LED pattern thereby substantially corresponds to a flame top edge of a flame area in which the flames are imaged in the fireplace video.

22 Claims, 5 Drawing Sheets

(56) References Cited

U.S. PATENT DOCUMENTS

| | | | |
|---|---|---|---|
| 2014/0373406 A1* | 12/2014 | Flynn | F24C 7/004 |
| | | | 40/428 |
| 2017/0009960 A1 | 1/2017 | Ahn et al. | |
| 2017/0089587 A1* | 3/2017 | Nemes | F24C 15/36 |
| 2018/0347818 A1* | 12/2018 | Birnbaum | F24C 7/004 |
| 2023/0130255 A1* | 4/2023 | Van Schie | F24B 1/1808 |
| | | | 40/428 |

FOREIGN PATENT DOCUMENTS

| | | |
|---|---|---|
| GB | 2467219 | 7/2010 |
| WO | 2008/145966 | 12/2008 |
| WO | 2009/141432 | 11/2009 |

\* cited by examiner

ARTIFICIAL FIREPLACE FOR DISPLAYING AN ARTIFICIAL FIRE PATTERN

FIELD OF THE INVENTION

The present invention relates to a an artificial fireplace for displaying an artificial fire pattern. The present invention further relates to a method of displaying a fireplace video.

STATE OF THE ART

Artificial fireplaces are generally known and are configured to display an image of a fireplace without actual flames being present. Several types of artificial fireplaces are known, for example comprising a semi-transparent mirror and configured to display flames by means of a Pepper's ghost hologram projection. An example of such an artificial fireplace is disclosed in U.S. Pat. No. 5,195,820 A.

For this type of artificial fireplace, a display device is arranged in a top part of the fireplace, which is configured to display a fireplace video that for example comprises an image of flames. The displayed video is reflected by the semi-transparent mirror into a horizontal direction and is thereby combined with an image of the fireplace background that is transmitted by the semi-transparent mirror from a rear part of the fireplace. Such a transmitted image may additionally comprise an image of artificial fireplace elements, such artificial logs, which are arranged within the housing of the artificial fireplace.

A drawback of this type of artificial fireplace is that the brightness of the display device needs to be relatively high, since the semi-transparent mirror generally only reflects a portion of the light from the display device. Such a display device, generally known as a daylight screen, is an LCD-screen that comprises a backlight source with a relatively high intensity, such that the intensity of the displayed video can be relatively high as well.

However, not only the intensity of the displayed video is thereby increased, but also the backlight itself becomes visible in the fireplace video, in particular in dark areas within the video. For example next to the displayed flames, which have a high intensity, a backlight glow may be visible, whereas the surroundings of the flames should be dark ideally. This backlight glow reduces the overall quality of the displayed flames in the fireplace video, since the reflected backlight glow interferes with the displayed flames, thereby reducing the illusion of a real fire that generally comprises bright flames and a dark background.

OBJECT OF THE INVENTION

It is therefore an object of the present invention to provide an artificial fireplace that has an improved video quality the amount of backlight glow, or at least to provide an alternative artificial fireplace.

DESCRIPTION OF THE INVENTION

The present invention provides an artificial fireplace for displaying and artificial fire pattern. The artificial fireplace comprises a display device and a fireplace video that at least comprises flames that are imaged in a flame area. The display device comprises:
- a backlight source, which comprises a plurality of LEDs, which are disposed in an LED pattern, wherein the backlight source is configured to emit light with the LEDs, and
- an LCD-panel, which is configured to selectively transmit and/or modulate light from the backlight source, in order to display the fireplace video, characterized in that the LED pattern is adapted to the flames that are displayed, e.g. on manufacturing of the artificial fireplace, in order to only emit backlight onto the LCD-panel where the flames are to be displayed, such that an edge of the LED pattern substantially corresponds to a flame top edge of a flame area in which the flames are imaged in the fireplace video.

Compared to the known display devices for artificial fireplaces, the display device according to the present invention has a reduced amount of backlight glow that is displayed in addition to the fireplace video. The display device according to the present invention thereby provides the advantage that the quality of the displayed fireplace video, and in particular the flames therein, is improved and that the artificial fireplace with such a display device is able to display a more realistic artificial fire pattern.

The display device according to the present invention is a Liquid-Crystal Display (LCD) that comprises a backlight source, which is configured to emit light by means of the LEDs. Compared to conventional display devices, the amount of emitted backlight is relatively high, in order to obtain a video with a relatively high brightness. The backlight source is configured to emit light that is substantially white.

The display device in the artificial fireplace may be a high-brightness display device, which may have a brightness of 800 nits, or even larger, for example 1,500 nits, whereas conventional display device typically have a brightness of only 300 nits. Such high-brightness display devices have been found useful in artificial fireplaces, because the realism of the imaged flames improves with an increased brightness of the display device.

The LEDs of the backlight source may be disposed in a grid-like manner, such that they are spaced from each other by a certain constant distance. The LEDs together define the LED pattern, having a certain outer contour around the outermost LEDs in the LED pattern.

Furthermore, the use of LEDs may provide for an increased intensity, a reduced energy consumption and also for a reduced amount of generated heat, when compared to for example conventional LCD displays that comprise cold cathode fluorescent lamps (CCFLs).

The light from the backlight source is configured to illuminate the LCD-panel of the display device. The LCD-panel is configured to selectively transmit backlight and to selectively modulate backlight, in dependence of the fireplace video that is to be displayed. The LCD-panel may be composed of a plurality of pixels, wherein each of the pixels is individually controllable to either absorb or transmit light from the backlight source. The pixels are furthermore individually controllable to modulate the wavelength, e.g. the colour, of the light that is transmitted, for example by filtering out all light with a different wavelength than the desired wavelength. A combined image of all pixels in the LCD-panel eventually forms the overall image that is displayed by the display device.

According to the present invention, the display device is configured to display a fireplace video with flames therein. Such a fireplace video may, for example, be composed of flames, which may be red, orange, yellow or a combination thereof, in front of a dark, e.g. a black background. Preferably, the surrounding background is as dark as possible, in order to improve the visibility of the artificial fireplace elements, such as logs, within the artificial fireplace.

In the displayed fireplace video, the flames are imaged in a flame area of the fireplace video. The dark background in the fireplace video may form a remainder of the fireplace video that surrounds the flame area. In the dark background of the fireplace video, no flames are present, which implies that no LEDs may be needed there to display the fireplace video. The fixed positions of the LEDs, only being present in the flame area, limit the variety of flame sizes and shapes that can be projected. However, already at the manufacturing of the artificial fireplace, the flame video content is known and the position of the flames therein is fixed. The pattern of the LEDs is specifically adjusted to the flame area of the flames in the video. As a result, also the contour of the LED pattern in the backlight source can be decided upon during manufacturing of the artificial fireplace and can remain unchanged during the lifetime of the artificial fireplace and the display device.

The display device according to the present invention further provides that an edge of the LED pattern substantially corresponds to a flame top edge of the flame area. The LEDs in the backlight source are thus only present in a region that corresponds to the flame area, for example overlapping therewith, and no LEDs project in a region of the fireplace video above the flame top edge.

Outside the LED pattern, no illumination of the LCD-panel is needed, since no flames need to be projected there. Outside the LED pattern, the display device may therefore lack any LEDs. During manufacturing of such a display device, LEDs can only be placed inside the LED pattern and no LEDs are placed outside the LED pattern.

However, the display device may alternatively comprise LEDs outside the LED pattern, but these LEDs must be covered, to prevent the LEDs from being visible outside the LED pattern. This covering should ideally be done inside the display device, e.g. in between the LEDs in the backlight source and the LCD-panel.

With the term substantially corresponding, it is meant that the edge of the LED pattern follows a contour along the tops of the flames that are displayed in the fireplace video. The edge of the LED pattern not necessarily follows the entire contour of each of the flames, but may rather follow only the tops of the flames in a manner that may similar to moving average line in a graph.

The LED pattern is thus specifically adapted to the flames that are displayed, e.g. on manufacturing of the artificial fireplace, in order to only emit backlight onto the LCD-panel where the flames are to be displayed. Accordingly, the backlight source does not comprise any LEDs in a region that falls outside the flame area and is at least free of LEDs in an area above the displayed flame top edge in the fireplace video.

The displayed flames in the fireplace video vary over time and in particular the height of the flames may vary due to flickering and/or as a result of a certain intensity setting for the artificial fireplace. In order to enable all flames of different heights to be displayed in their entirety, the LED pattern substantially corresponds to the flame area for the largest flames, such that the edge of the LED pattern substantially corresponds to the flame top edge for these largest flames.

The display device according to the present invention reduces the backlight glow in the displayed video, since no LEDs project onto areas outside the flame area. These LEDs would otherwise not contribute in displaying the flames, so omitting these LEDs will not negatively influence the visibility of the flames, but their negative influence on the backlight glow will be reduced.

A further advantage of the display device according to the present invention is that the provision of fewer LEDs, e.g. only in a LED pattern corresponding to the flame area instead of across the entire display device, reduces the energy consumption of the display device, compared to when the LEDs were to be provided across the entire display device. The same applies for the amount of heat that is undesirably generated by the backlight source, since fewer LEDs are present.

In an embodiment, the entire LED pattern substantially corresponds to the flame area. This implies that not only a top edge of the LED pattern substantially corresponds to the flame top edge of the flame area, but also that other edges of the LED pattern correspond to edges of the flame area and that no LEDs project outside the entire flame area, instead of only not being present above the flame top edge.

For example, this embodiment of the display device may provide that a bottom edge of the LED pattern may have an arc shape that corresponds to a bottom edge shape of the flame area. The bottom edge of the flame area may have such an arc shape, because the fireplace video with the flames is merged in the artificial fireplace by the semi-transparent with an image of artificial fireplace elements, e.g. artificial logs. These logs may be arranged on top of each other, being higher in the middle of the fireplace than on the side. To improve the realism of the displayed flames, the bottom edge of the flame area, and thus also the bottom edge of the LED pattern, may follow this contour of the artificial fireplace elements with a corresponding arc shape.

Since no LEDs are present below the bottom edge of the flame area, the backlight glow is not only reduced above the flames in the fireplace video, but also below the displayed flames.

In an embodiment, the display device is configured to display the fireplace video in a rectangular display area of the device, wherein the LED pattern spans part of the rectangular display area, and wherein a remaining part of the rectangular display area, e.g. outside the part spanned by the LED pattern, is free of LEDs.

The rectangular display area of the display device may correspond to an overall outer perimeter of the display device, which may be rectangular, similar as in any prior art display device. However, the area in which the LEDs of the backlight source are present, e.g. in the LED pattern, does not correspond to the rectangular display area.

Instead, the LED pattern spans only part of the rectangular display area, which implies that not the entire rectangular display area is occupied with LEDs. Outside the flame area in the fireplace video, no flames need to be displayed. Accordingly, no LEDs are required outside the LED pattern.

In a further embodiment, the above-mentioned edge of the LED pattern is offset from a neighbouring rectilinear edge of the rectangular display area. This implies that the edge of the LED pattern does not accurately follow the edge of the rectangular display area, but that that is may, at least locally, be spaced at a distance therefrom. Insofar the edge of the LED pattern is spaced from the edge of the rectangular display area, no LED are visible in that part of the display area between the edge of the rectangular display area and the edge of the LED pattern.

In a further embodiment, a top edge of the LED pattern is a non-rectilinear top edge that is offset from a rectilinear top edge of the top edge of the rectangular display area. The non-rectilinear top edge of the LED pattern may, for example, have an irregular or craggy shape. According to this embodiment, the flame top edge of the LED pattern may follow the shape of the tops of flames, for example in a manner that may similar to moving average line in a graph.

In this embodiment, a spacing may be present in between the tops that may form the top edge of the LED pattern and the rectilinear top edge of the top edge of the rectangular display area.

In a further embodiment, the top edge of the LED pattern substantially corresponds to a flame top edge, e.g. a non-rectilinear flame top edge of the flame area. As such, no LEDs are provided in a region above the flame area, e.g. where no flames need to be displayed and where thus no LEDs are required.

In an embodiment, all edges of the LED pattern are offset from respective neighbouring rectilinear linear edges of the rectangular display area. Instead of the above-mentioned spacing being only present between one of the edges of the LED pattern and one of the neighbouring rectilinear edges of the rectangular display area, may the present embodiment comprise a spacing between each of the edges of the LED pattern and their respective neighbouring rectilinear edges of the rectangular display area. The LED pattern is thus spaced at a distance from all rectilinear edges of the display area, so that LEDs may only be present in the LED pattern in a central region of the rectangular display area and that parts of the rectangular display area near the edges thereof may be free of LEDs.

In a further embodiment, all edges of the LED pattern are non-rectilinear edges that substantially correspond to all respective flame edges of the flame area. Similar as before, no LEDs are provided in a region outside the flame area, e.g. where no flames need to be displayed and where thus no LEDs are required.

In an embodiment, the display device comprises a reflector panel that is configured to reflect the emitted backlight in a frontal direction, such that the majority of the emitted light is emitted in a frontal direction, e.g. in a direction towards the users.

The reflector panel comprises a surface with a high reflectivity, which may be faced towards the LEDs of the backlight source. The surface of the reflector panel in particular has a high reflectivity for light having wavelengths in the visible regime, in order to enable reflection of the backlight in a frontal direction. The reflector panel may thereby be located behind the backlight source, such that the high-reflective surface faces in the frontal direction, in order to reflect backlight that is emitted in a direction opposite to the frontal direction.

However, according to the present display device with a backlight source with LEDs, each of the LEDs may also protrude forward from the circuit board of the backlight source. The reflector panel thereby comprise a plurality of cavities, which are disposed in a pattern that corresponds to the LED pattern, such that the reflector panel can be disposed in front of the circuit board. The LEDs thereby protrude through the cavities in the reflector panel, such that they are disposed in front of the reflector panel and adjacent to the high-reflective surface.

In a further embodiment, the high-reflective surface of the reflector panel comprises a high-reflective coating, for example a white coating. This coating may, for example, be a paint that is applied on the reflector panel or may be a foil layer on the reflector panel.

Such a high-reflective coating is able to reflect a relatively large percentage of the total amount of incident light and to absorb only a relatively small percentage, preferably being configured not to absorb light at all. Accordingly, the amount of light that is reflected towards the LCD-panel may be increased, when compared to a reflector surface that does not comprise such a coating. Furthermore, the overall brightness of the display device may be increased accordingly due to the reflected backlight.

The high-reflective coating may comprise a bright colour, for example white, in order to reflect all colours of light having wavelengths in the visible regime. Alternatively or additionally, the high-reflective coating may comprise a gloss surface texture that may increase the amount of reflected light as well.

In an embodiment, the high-reflective surface of the reflector panel only spans across a portion of the panel, having a high-reflective surface area that substantially corresponds to the flame area. The reflector panel thus only has a high reflectivity in an area that corresponds to the flame area of the flames in the fireplace video. Accordingly, a remainder of the reflective surface, outside the high-reflective surface area, may have a lower reflectivity.

This embodiment provides that the reflector panel is only configured, or at least mainly configured to reflect the backlight in the flame area and that backlight outside of the flame area is not reflected, or at least to a smaller extent. The reduced reflections provide that the area outside the flame area in the displayed fireplace video is illuminated by less backlight, since the reflector panel does not reflect backlight outside the flame area, or at least to a smaller extent.

The provision of the high-reflective surface area only spanning part of the reflector panel further reduces the visibility of a backlight glow in the area outside the flame area, and thus further improves the quality of the displayed fireplace video and the realism of the artificial fire pattern that will be displayed by the artificial fireplace.

In a further embodiment, the high-reflective surface area substantially corresponds to the LED pattern. At the height of the LED pattern, the reflectivity of the surface of the reflector panel is thereby high, in order to optimally reflect the backlight within this pattern. As such, the reflectivity of the reflector panel is optimally adapted to the locations from which the backlight is emitted, in order to further reduce the backlight glow.

In an additional embodiment, a remaining portion of the reflector panel, e.g. outside the high-reflective surface area, comprises a surface with a low reflectivity that is configured to absorb light. Instead of reflecting light, this remaining portion of the reflector panel is rather configured to absorb light, in order to prevent reflections of backlight in areas that are outside the flame area, for example in the dark background area of the fireplace video.

These undesired backlight reflections outside the flame area would otherwise give rise to the backlight glow, which implies that the present reduction of these reflections further reduces the presence of the backlight glow and further improves the quality of the displayed fireplace video.

In a further embodiment, the low-reflective surface of the reflector panel comprises a low-reflective coating, for example a black coating. This coating may, for example, be a paint that is applied on the reflector panel or may be a foil layer on the reflector panel.

Such a low-reflective coating is able to absorb a relatively large percentage of the total amount of incident light and to reflect only a relatively small percentage, preferably being configured not to reflect light at all. Accordingly, the amount of light that is reflected towards the LCD-panel may be reduced, when compared to a reflector surface that does not comprise such a coating. Accordingly, the amount of reflected backlight outside the flame area is further reduced, thereby further reducing the backlight glow.

The low-reflective coating may comprise a dark colour, for example black, in order to absorb all colours of light having wavelengths in the visible regime. Alternatively or additionally, the low-reflective coating may comprise a matt surface texture that may further increase the amount of absorbed light.

In an alternative or additional embodiment, the reflector panel comprises a transitional reflective surface with a high reflectivity in between the high-reflective surface area and the low-reflective surface area, wherein the transitional reflective surface is also configured to reflect light.

This transitional reflective surface may provide for a smooth transition in the displayed fireplace video between the flame area, with the flames, and the surrounding dark background area. This smooth transition prevents a sudden transition in reflectivity and a boundary line to be clearly visible between the high-reflective surface area and the low-reflective surface area. Hence, the flames in the flame area are relatively bright, due to the large amount of backlight there, whereas the brightness of the surrounding dark background areas is relatively low. The transitional reflective surface provides for a smooth transition for this difference in brightness, in order to further improve the quality of the displayed fireplace video.

The transitional reflective surface is located in between the high-reflective surface area and the low-reflective surface area and is thus disposed around the flame area, such that the entire flame area mainly remains covered by the high-reflective surface.

The transitional reflective surface has a relatively high reflectivity, but differs from the high-reflective surface, since the transitional reflective surface is not disposed adjacent to the LEDs of the backlight source.

In a further embodiment, the transitional reflective surface of the reflector panel comprises a high-reflective coating, for example a white coating. Such a high-reflective coating is able to reflect a relatively large percentage of the total amount of incident light and to only absorb a relatively small percentage, preferably being configured not to absorb light at all. Accordingly, a smooth transition of backlight may be achieved between the high-reflective surface and the transitional reflective surface, in order to improve the realism of the displayed flames.

The high-reflective coating may comprise a bright colour, for example white, in order to reflect all colours of light having wavelengths in the visible regime. Alternatively or additionally, the high-reflective coating may comprise a gloss surface texture that may increase the amount of reflected light.

In an embodiment, the display device further comprises a mask, which is located in between the backlight source and the LCD-panel and which comprises an absorbing mask surface that is configured to absorb light. The mask further comprises a mask aperture in the mask surface, which has a shape that substantially corresponds to the flame area. Here, the term substantially corresponding also means an edge of the mask aperture follows the contour of the flame area in which the flames are imaged in the fireplace video. The edge of the mask aperture not necessarily follows the entire contour of each of the flames, but may rather follow only the tops of the flames in a manner that may similar to moving average line in a graph.

The mask is configured to absorb light with its absorbing mask surface, but enables transmission of light through the mask aperture. Since the mask aperture has a shape that corresponds to the flame area, the mask enables transmission of backlight within the flame area, but rather prevents transmission of light outside the flame area.

The mask thus further reduces the amount of backlight outside the flame area, in order to further reduce the backlight glow. Furthermore, as a result of the mask being located between the backlight source and the LCD-panel, not only direct light from the backlight source can be absorbed by the mask, but also indirect light from the backlight source, being reflected by the reflector panel, can be absorbed.

In a further embodiment of the display device, the absorbing mask surface comprises an absorbing coating, for example a black coating. This coating may, for example, be a paint that is applied on the mask or may be a foil layer on the mask.

Such an absorbing coating is able to absorb a relatively large percentage of the total amount of incident light and to only reflect a relatively small percentage, preferably being configured not to reflect light at all. Accordingly, the amount of light that is reflected towards the LCD-panel may be reduced, when compared to a mask surface that does not comprise such a coating. Accordingly, the amount of absorbed backlight outside the flame area is further increased, further reducing the backlight glow.

The absorbing coating may comprise a dark colour, for example black, in order to absorb all colours of light having wavelengths in the visible regime. Alternatively or additionally, the absorbing coating may comprise a matt surface texture that may further increase the amount of absorbed light.

In an alternative or additional embodiment, the mask comprises a transitional mask surface outside the mask aperture, which is configured to reflect light and which has a gradual change in reflectivity from the mask aperture towards the absorbing mask surface.

This transitional mask surface may also contribute to a smooth transition in the fireplace video between the flame area, with the displayed flames, and the surrounding dark background area. Hence, the flames in the flame area are relatively bright, due to the large amount of backlight there, whereas the brightness of the surrounding dark background areas is relatively low. The transitional mask surface may contribute further to a smooth transition for this difference in brightness, in order to further improve the quality of the displayed fireplace video.

The transitional mask surface is located outside the mask aperture and is thus disposed around the flame area, such that the entire flame area projects through the mask aperture. Accordingly, the absorbing mask surface is, in turn, located outside the transitional mask surface.

Directly adjacent to the mask aperture, the transitional mask surface has a relatively high reflectivity. However, the reflectivity of the transitional mask surface decreases upon moving away from the mask aperture towards a relatively low reflectively directly adjacent to the absorbing mask surface.

In a further embodiment, the transitional mask surface has a gradual change in colour, for example gradually changing from white to black. Directly adjacent to the mask aperture, the transitional mask surface may have a white colour, whereas the colour gradually changes towards grey when moving away from the mask aperture, eventually becoming black directly adjacent to the absorbing mask surface.

Alternatively or additionally, the transitional mask surface may have a surface texture that gradually changes from being a gloss surface texture directly adjacent to the mask aperture, to being a relatively matt surface texture directly adjacent to the absorbing mask surface.

In a further embodiment, the artificial fireplace further comprises:
- a housing, defining an interior and comprising at least one opening to allow a line of sight into the interior of the housing,
- a semi-transparent mirror, which is arranged in the interior of the housing and which comprises:
- a first side, facing the opening, and
- an opposite second side, facing away from the opening, and
- a fireplace background, which is arranged in the housing, wherein the display device is arranged in the housing and configured to display a first fireplace video, wherein the semi-transparent mirror is arranged to at least partially reflect the first fireplace video at its first side and to at least partially transmit an image of the fireplace background at its second side, in order to recombine the first fireplace video and the background image into the artificial fire pattern, such that the artificial fire pattern is visible along the line of sight.

The artificial fireplace according to the present embodiment is configured to display a first fireplace video with the display device, which is emitted towards the first side of the semi-transparent mirror, where the first fireplace video is at least partially reflected to be visible through the opening in the housing and along the line of sight.

The fireplace background faces the second side of the semi-transparent mirror and is visible at the back of the housing as a background image. This background image is transmitted through the semi-transparent mirror along the line of sight.

This recombining by the semi-transparent mirror generates a layered effect in the fireplace, since the fireplace video is, when seen along a line of sight through the semi-transparent mirror, displayed such, that the flames in the fireplace video appear to originate from a first, preferably vertical plane, whereas the background image originates from the back of the artificial fireplace and at a distance from where the flames in the fireplace video appear to originate.

According to a further aspect, the present invention provides a method for displaying a fireplace video with an artificial fireplace that comprises a display device, for example an artificial fireplace as disclosed herein, comprising the steps of:
- providing a fireplace video, which at least comprises flames that are imaged within a flame area,
- emitting light with a backlight source of the display device,
- illuminating an LCD-panel with the light,
- selectively transmitting and/or modulating the light with the LCD-panel to display the fireplace video,
- characterized in that the backlight source comprises a plurality of LEDs for the emitting of the light, which are disposed in an LED pattern, wherein the LED pattern is adapted to the flames that are displayed, e.g. on manufacturing of the artificial fireplace, in order to only emit backlight onto the LCD-panel where the flames are to be displayed, such that an edge of the LED pattern substantially corresponds to a flame top edge of the flame area.

Compared to the known methods for displaying a fireplace video with a display device, the method according to the present invention may result in a reduced amount of backlight glow that is displayed in addition to the fireplace video. The method according to the present invention thereby provides the advantage that the quality of the displayed fireplace video, and in particular the flames therein, is improved and that, in particular when carried out by means of an artificial fireplace with a display device as described above, a more realistic artificial fire pattern is displayed.

With the method according to the present invention, a fireplace video is displayed with flames therein. Such a fireplace video may, for example, be composed of flames, which may be red, orange, yellow or a combination thereof, in front of a dark, e.g. a black background. Preferably, the surrounding background is as dark as possible, in order to improve the visibility of artificial fireplace elements, such as logs, within the artificial fireplace.

In the displayed fireplace video, the flames are imaged in a flame area of the fireplace video and the dark background forms a remainder of the fireplace video that surrounds the flame area. In the dark background of the fireplace video, no flames are present, which implies that no LEDs may be needed there to display the fireplace video.

With the method according to the present invention, it is provided that an edge of the LED pattern substantially corresponds to a flame top edge of the flame area. The LEDs in the backlight source are thus only present in a region that corresponds to the flame area, for example overlapping therewith, and no LEDs project in a region of the fireplace video above the flame top edge.

Outside the LED pattern, no illumination of the LCD-panel is needed, since no flames need to be projected there. Outside the LED pattern, the display device may therefore lack any LEDs. During manufacturing of such a display device, LEDs can only be placed inside the LED pattern and no LEDs are placed outside the LED pattern.

However, the display device may alternatively comprise LEDs outside the LED pattern, but these LEDs must be covered, to prevent the LEDs from being visible outside the LED pattern.

The LED pattern is thus specifically adapted to the flames that are displayed, e.g. on manufacturing of the artificial fireplace, in order to only emit backlight onto the LCD-panel where the flames are to be displayed. Accordingly, the backlight source does not comprise any LEDs in a region that falls outside the flame area and is at least free of LEDs in an area above the displayed flame top edge in the fireplace video.

The displayed flames in the fireplace video vary over time and in particular the height of the flames may vary due to flickering and/or as a result of a certain intensity setting for the artificial fireplace. In order to enable all flames of different heights to be displayed in their entirety, the LED pattern substantially corresponds to the flame area for the largest flames, such that the edge of the LED pattern substantially corresponds to the flame top edge for these largest flames.

With the method according to the present invention, a backlight glow in the displayed video is reduced, since no LEDs project onto areas outside the flame area. These LEDs would otherwise not contribute in displaying the flames, so omitting these LEDs will not negatively influence the visibility of the flames, but their negative influence on the backlight glow will be reduced.

A further advantage of the method according to the present invention is that the provision of fewer LEDs, e.g. only in a LED pattern corresponding to the flame area instead of across the entire display device, reduces the energy consumption of the display device, compared to when the LEDs were to be provided across the entire display device. The same applies for the amount of heat that is undesirably generated by the backlight source, since fewer LEDs are present.

BRIEF DESCRIPTION OF DRAWINGS

Further characteristics of the invention will be explained below, with reference to embodiments, which are displayed in the appended drawings, in which.

Throughout the figures, the same reference numerals are used to refer to corresponding components or to components that have a corresponding function.

DETAILED DESCRIPTION OF EMBODIMENTS

Figure 1:
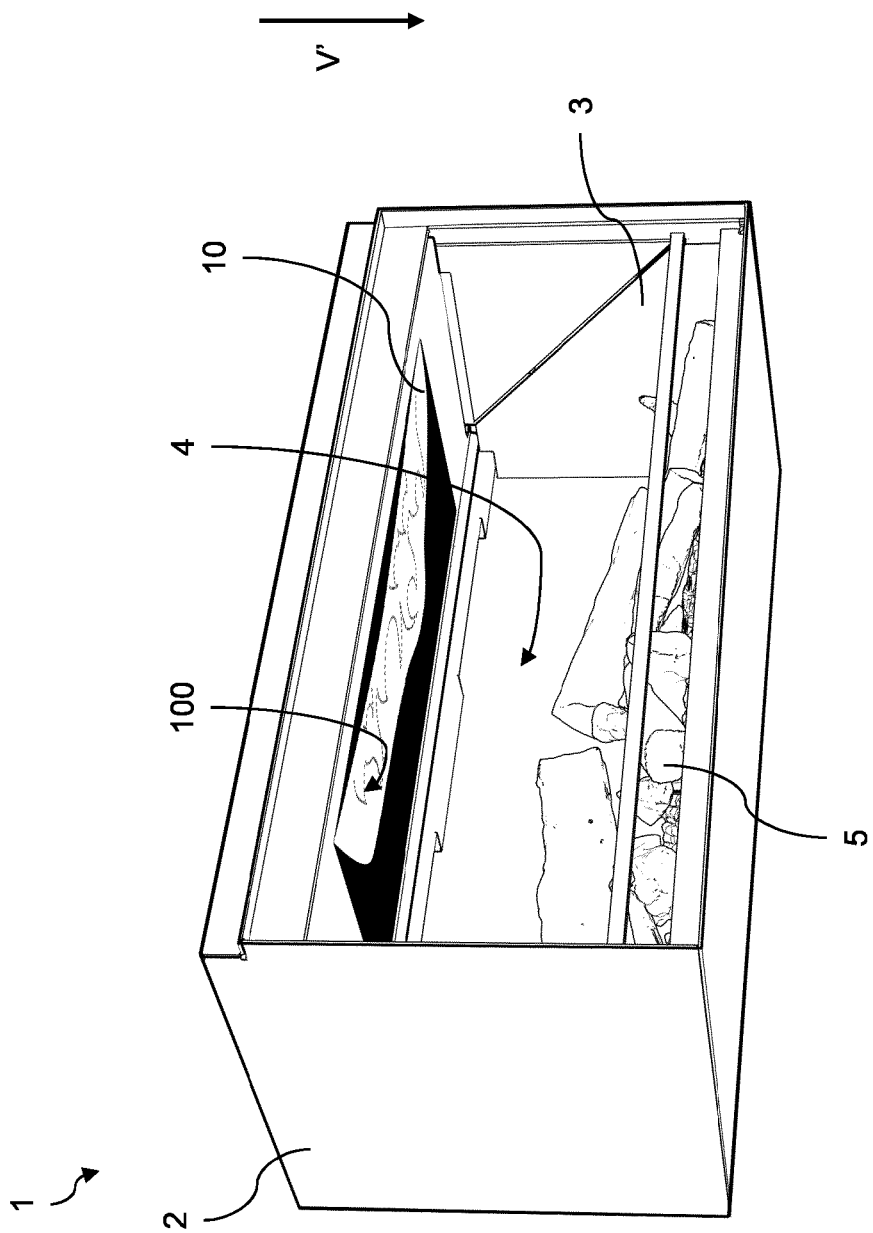
FIG. 1 shows an embodiment of the artificial fireplace according to the present invention.

FIG. 1 schematically depicts an embodiment of the artificial fireplace according to the present invention, to which is referred with reference numeral 1. The artificial fireplace 1 comprises a housing 2 with an interior and with an opening at a front side thereof to enable a line of sight into the interior of the housing 2.

The artificial fireplace 1 comprises a semi-transparent mirror 3, which is arranged in the interior of the housing 2. The mirror 3 is set at a 45-degree angle with the horizontal and vertical direction and comprises a first side that faces towards the opening in the housing 2 and an opposed second side that faces away from the opening. The artificial fireplace 1 further comprises a fireplace background 4, which is located in the interior of the housing, e.g. at a rear wall thereof. The artificial fireplace 1 further comprises an artificial fireplace element in the form of multiple artificial logs 5, which is disposed in the interior of the housing 2, e.g. behind the mirror 3, when seen along the line of sight.

The artificial fireplace 1 further comprises a display device 10, which is located in the interior of the housing 2, e.g. in a top part thereof. The display device 10, which will be discussed in more detail in the following, is configured to display a fireplace video 100 that comprises flames 101.

The display device 10 is arranged in a substantially horizontal plane and faces in a downward vertical direction (V'). The display device 10 is thereby configured to display the fireplace video 100 in the downward vertical direction (V') and to project the fireplace video 100 onto the first side of the semi-transparent mirror 3.

Figure 2:
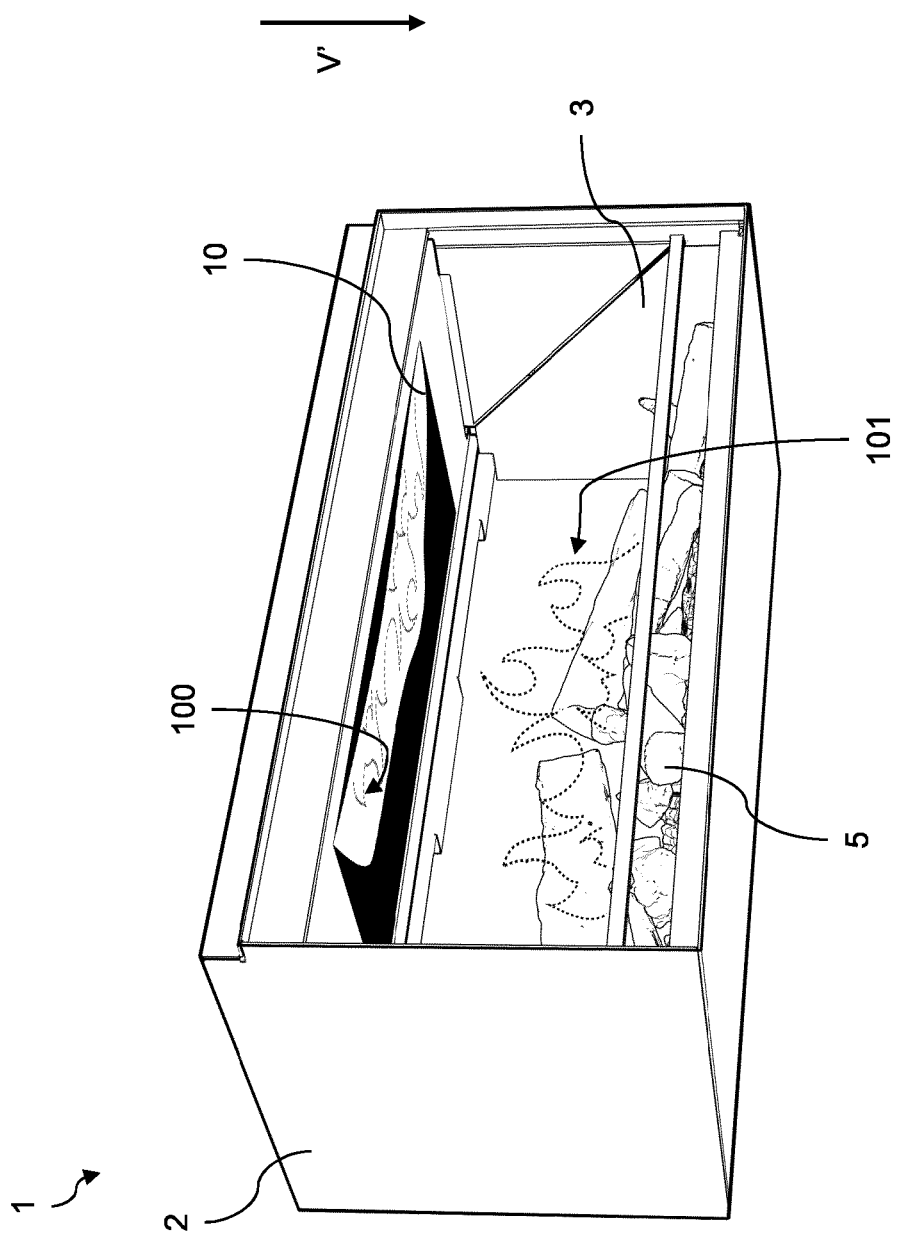
FIG. 2 shows the artificial fireplace of FIG. 1, displaying flames in a fireplace video.

In FIG. 2, the artificial fireplace 1 of FIG. 1 is shown in an activated state. In FIG. 2, it is shown that the fireplace video 100 is displayed by the display device 10 and that the flames 101 in the fireplace video 100 are reflected on the first side of the semi-transparent mirror 3. The semi-transparent mirror 3 is thereby configured to transmit an image of the fireplace background 4 and the artificial fireplace elements 5 at its second side and to reflect the fireplace video 100 at its first side, in order to recombine those images and to display an artificial fire pattern along the line of sight.

Figure 3:
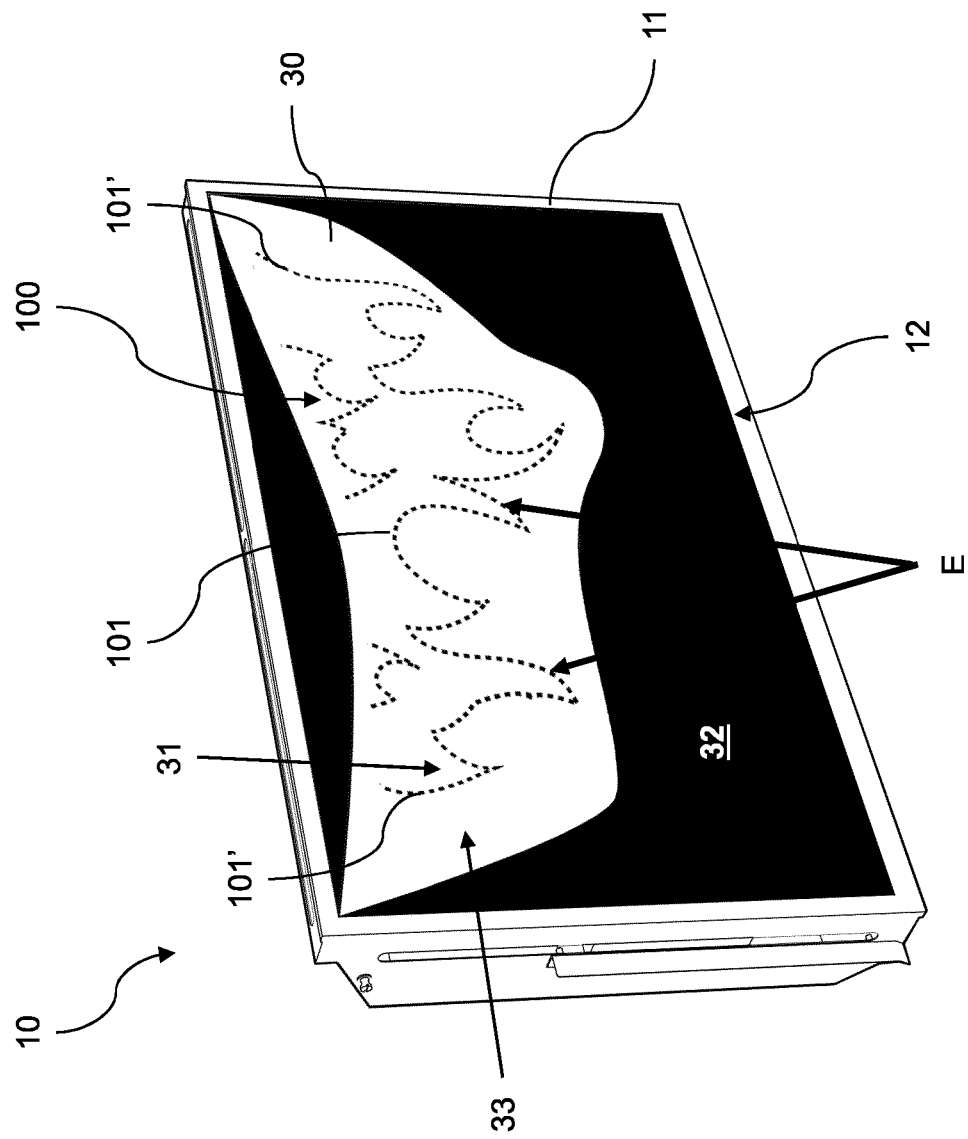
FIG. 3 shows an embodiment of the display device according to the present invention.

In FIG. 3, an embodiment of the display device 10 is shown. The display device 10 comprises a housing 11 and a display screen 12. The display device 10 is configured to display a fireplace video 100 that comprises flames 101.

The flames 101 are displayed upside down in FIG. 3, which is done to effect that the eventual flames in the artificial fire pattern are shown in the appropriate orientation, due to the reflecting on the first side of the semi-transparent mirror 3 and reversion of the image.

In FIG. 3, it is shown that the flames 101 in the fireplace video 100 only cover a part of the entire display screen 12. This part of the fireplace video 100 with the flames 101 is defined as the flame area of the fireplace video 100. A remainder of the fireplace video 100 is formed by a dark background that surrounds the flame area.

The flames 101 have top edges at their flame tips, e.g. bottom edges in the upside down representation in FIG. 3, which together form a flame top edge (E) that delimits the flame area at the top. In FIG. 3, the flame top edges are displayed by local minima of the lowermost dashed line.

At its respective left and right sides, the flame area is delimited by the outermost flames 101' in the fireplace video 100. At the bottom, e.g. the top in FIG. 3, the flame area is delimited by an arc-shaped lower contour of the lowermost flames 101.

The display device 10 comprises a backlight source, not shown in FIG. 3, and a reflector panel 30. The reflector panel 30 spans across the entire display device 10 and has dimensions that substantially correspond to the dimensions of the display screen 12. The reflector panel 30 is located adjacent to the backlight source and is configured to reflect light.

The reflector panel 30 comprises a high-reflective surface 31, which comprises a white high-reflective coating and which has a smooth surface structure, in order to increase its reflectivity. In FIG. 3, the high-reflective surface 31 is shown as a black plane.

The high-reflective surface 31 spans across a portion the reflector panel 30 and has a high-reflective surface area that corresponds to the flame area. The high-reflective surface area is shown in FIG. 3 as being the part of the white reflector panel 30 that is within the dotted line that indicates the flame top edge (E), thereby projecting onto the flame area.

The high-reflective surface 31 is configured to reflect light, in particular backlight, at the locations where flames 101 are visible in the fireplace video 100, e.g. within the flame area. The high-reflective surface 31 is thus configured to enhance the amount of light that is available for displaying the flames 101, in order to increase the brightness of the fireplace video 100 and to improve the visibility of the flames 101 therein.

The reflector panel 30 further has a low-reflective surface 32 that surrounds the high-reflective surface 31, wherein the low-reflective surface 32 has a extends reflectivity than the high-reflective surface 31. The low-reflective surface 32 projects outside the flame area and is configured to absorb light. In FIG. 3, the low-reflective surface 32 is shown as a black plane.

The low-reflective surface 32 of comprises a black, low-reflective coating, in order to absorb all colours of light having wavelengths in the visible regime. Furthermore, the low-reflective coating comprises a matt surface texture that may further increase the amount of absorbed light.

As a result of the low-reflective surface 32, light is not reflected outside the flame area, or at least reflected to a smaller extent. The reduced reflections provide that the dark background, surrounding the flame area in the displayed fireplace video 100, is illuminated by less light.

The provision of both the high-reflective surface 31 and the low reflective surface 32 further reduces the amount of backlight glow in the dark background, surrounding the flame area, and thus further improves the quality of the displayed fireplace video 100 and the realism of the artificial fire pattern that will be displayed by the artificial fireplace.

The reflector panel 30 further comprises a transitional reflective surface 33, which also comprises a white high-reflective coating and which also has a smooth surface structure, in order to increase its reflectivity.

The transitional reflective surface 33 spans across another portion the reflector panel 30 and is located in between the high-reflective surface 31 and the low-reflective surface 32. Accordingly, the transitional reflective surface 33 is shown in FIG. 3 as being the part of the white reflector panel 30 that is outside the dotted line that indicates the flame top edge (E), thereby projecting outside the flame area.

The transitional reflective surface 33 is also configured to reflect light, but rather next to the flames 101 in the fireplace video 100, e.g. outside the flame area. The transitional reflective surface 33 is thus configured to enhance the amount of light that is visible next to the flames 101, in order to provide for a smooth transition in the fireplace video 100 between the flame area, with the displayed flames 101, and the surrounding dark background area. Hence, the flames 101 in the flame area are relatively bright, due to the large amount of backlight there, whereas the brightness of the surrounding dark background area is relatively low. The transitional reflective surface 33 provides for a smooth transition for this difference in brightness, in order to further improve the quality of the displayed fireplace video 100.

Figure 4:
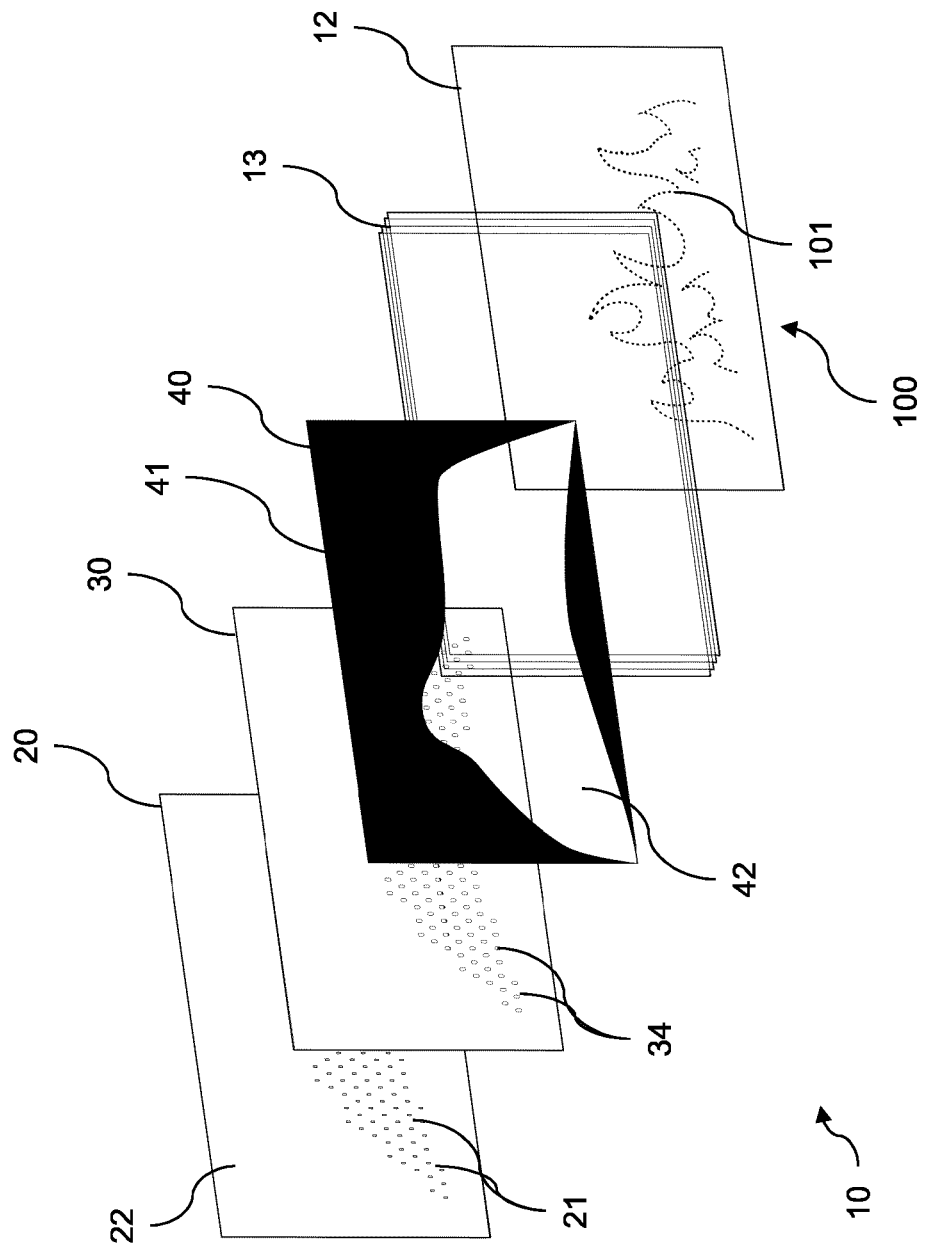
FIG. 4 shows an exploded-view representation on a display device.

In FIG. 4, an exploded-view representation of the display device 10 is shown. From front to rear, FIG. 4 shows the display screen 12, an LCD-panel 13, a mask 40, the reflector panel 30 and the backlight source 20 of the display device.

The backlight source 20 comprises a plurality of LEDs 21 which protrude forward from a circuit board 22 and is configured to emit light by means of the LEDs 21. The LEDs 21 are disposed in a grid-like manner, such that they are spaced from each other by a certain constant distance. The LEDs 21 together define the LED pattern, having a certain outer contour around outermost LEDs in the LED pattern.

The LED pattern substantially corresponds to the flame area of the flames in the fireplace video. This implies that edges of the LED pattern correspond to edges of the flame area and that no LEDs project outside the entire flame area. In particular, also a top edge of the LED pattern substantially corresponds to the flame top edge of the flame area.

The LED pattern of the backlight source 20 is thus specifically adapted to the flames that are displayed, in order to only emit backlight onto the LCD-panel 13 where the flames are to be displayed. Accordingly, the backlight source 20 does not comprise any LEDs in a region falling outside the flame area and is at least free of LEDs in an area above the displayed flame top edge of the flames in the fireplace video.

The displayed flames in the fireplace video vary over time and in particular the height of the flames may vary due to flickering and/or as a result of a certain intensity setting for the artificial fireplace. In order to enable all flames of different heights to be displayed in their entirety, the LED pattern substantially corresponds to the flame area for the largest flames, such that the edge of the LED pattern substantially corresponds to the flame top edge for these largest flames.

The display device 10 reduces the backlight glow in the displayed video, since no LEDs are present in areas that project outside the flame area. These LEDs would otherwise not contribute in displaying the flames, so omitting these LEDs will not negatively influence the visibility of the flames, but their negative influence on the backlight glow is reduced.

A further advantage of the display device 10 is that the provision of fewer LEDs, e.g. only in a LED pattern corresponding to the flame area instead of across the entire display device 10, reduces the energy consumption of the display device 10, compared to when the LEDs were to be provided across the entire display device 10. The same applies for the amount of heat that is undesirably generated by the backlight source 20, since fewer LEDs are present.

The reflector panel 30 is configured to reflect the emitted backlight in a frontal direction, in order to increase the brightness of the display device 10. In the embodiment of FIG. 4, the high-reflective surface 31 of the reflector panel 30 faces towards the LEDs 21 of the backlight source 20. The reflector panel 30 thereby comprise a plurality of cavities 34, which are disposed in a pattern that corresponds to the LED pattern, such that the reflector panel 30 can be disposed in front of the circuit board 22. The LEDs 21 thereby protrude through the cavities 34 in the reflector panel 30, such that they are disposed in front of the reflector panel 30 and adjacent to the high-reflective surface 31.

The light from the backlight source 20 is configured to illuminate the LCD-panel 13 of the display device 10. The LCD-panel 13 is configured to selectively transmit backlight and to selectively modulate backlight, in dependence of the fireplace video that is to be displayed. The LCD-panel 13 is composed of a plurality of pixels, wherein each of the pixels is individually controllable to either absorb or transmit light from the backlight source 20. The pixels are furthermore individually controllable to modulate the wavelength, e.g. the colour, of the light that is transmitted, for example by filtering out all light with a different wavelength than the desired wavelength. A combined image of all pixels in the LCD-panel 13 eventually forms the overall image that is displayed by the display device 10.

The display device 10 further comprises a mask 40, which is located in between the backlight source 20 and the LCD-panel 13 and which comprises an absorbing mask surface 41 that is configured to absorb light. The mask 40 further comprises a mask aperture 42 in its mask surface, which has a shape that substantially corresponds to the flame area.

The mask 40 is configured to absorb light with its absorbing mask surface 41, but enables transmission of light through the mask aperture 42. Since the shape of the mask aperture 42 corresponds to the flame area, the mask 40 enables transmission of backlight within the flame area, but rather prevents transmission of light outside the flame area.

The mask 40 thus further reduces the amount of backlight outside the flame area, in order to further reduce the undesired backlight glow. Furthermore, as a result of the mask 40 being located between the backlight source 20 and the LCD-panel 13, not only direct light from the backlight source 20 can be absorbed by the mask 40, but also indirect light from the backlight source 20, being reflected by the reflector panel 30, can be absorbed.

The absorbing mask surface 41 comprises a black, absorbing coating, in order to absorb all colours of light having wavelengths in the visible regime. Furthermore, the absorbing mask surface 41 comprises a matt surface texture that is configured to further increase the amount of absorbed light. The absorbing mask surface 41 is configured to absorb a relatively large percentage of a total amount of incident light, such that the amount of light that is reflected towards the LCD-panel 13 is reduced, when compared to a mask surface that does not comprise such a coating. Accordingly, the amount of absorbed backlight outside the flame area is further increased, further reducing the backlight glow.

Figures 5A, 5B:
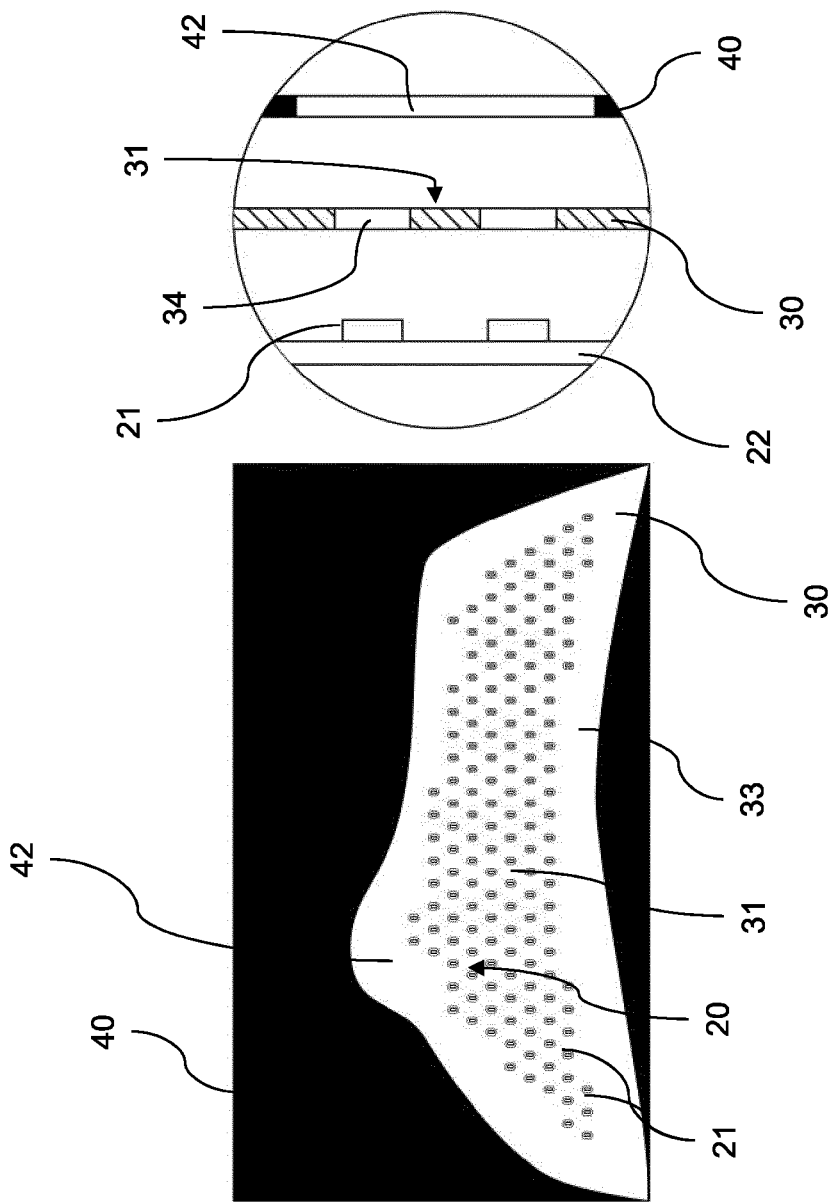
FIG. 5A shows a frontal view on the display device of FIG. 4.
FIG. 5B shows a cross-sectional view on the display device of FIG. 4.

In FIG. 5A a frontal view on the display device 10 of FIG. 4 is shown along the line of sight. FIG. 5A displays the LEDs 21 of the backlight source 20, which are disposed in the LED pattern and which project through apertures 34 in the reflector panel 30.

In between the LEDs 21 and within the LED pattern, the reflector panel 30 comprises the white high-reflective surface 31, which has a relatively large reflectivity in order to reflect backlight within the flame area and the corresponding LED pattern.

Outside the high-reflective surface 31, and therefore outside the flame area and the LED pattern, the reflector panel 30 comprises the transitional reflective surface 33, which is white as well. The transitional reflective surface 33 also has a relatively high reflectivity, in order to reflect backlight outside the flame area and the corresponding LED pattern, to obtain a smooth transition between the flames in the fireplace video and the surrounding dark background.

The LED pattern falls within the mask aperture 42 of the mask 40, in order to enable transmission of light through the mask aperture 42. Accordingly, the high-reflective surface 31 of reflector panel 30 and at least part of the transitional reflective surface 33 falls within the mask aperture 42 to enable transmission of light.

However, a remainder of the reflector panel 30 is covered by the absorbing mask surface 41, thereby absorbing any light outside the high-reflective surface 31 and the transitional reflective surface 33. This absorption by the mask surface 41 further reduces the amount of backlight outside the flame area, in order to further reduce the backlight glow. Furthermore, as a result of the mask 40 being located between the backlight source 20 and the LCD-panel 13, not only direct light from the backlight source 20 can be absorbed by the mask 40, but also indirect light from the backlight source 20, being reflected by the reflector panel 30, can be absorbed to further reduce the backlight glow.

FIG. 5B depicts a cross-sectional view on the display device of FIG. 4, wherein the relevant components are spaced at a distance from each other in an exploded-view representation.

FIG. 5B shows the backlight source 20 on the left, comprising the LEDs 21 that are mounted on the circuit board 22 and protrude away therefrom. The reflector panel 30 comprises a plurality of cavities 34, which are disposed in the same pattern as the LED pattern. The LEDs 21 are thereby configured to protrude through the cavities 34.

The LEDs 21 are configured to emit light, which is emitted through the mask aperture 42 of mask 40 that is arranged in front of the reflector panel 30. The high-reflective surface 31 of the reflector panel 30 is located in between the LEDs 21 and is configured to reflect backlight from the LEDs 21 that is transmitted towards the left in FIG. 5B.

The present invention is further illustrated by means of several embodiments, which are listed below:

Embodiment 1

Display device for an artificial fireplace, configured to display a fireplace video that at least comprises flames, wherein the display device comprises:

a backlight source, which comprises a plurality of LEDs, which are disposed in an LED pattern, wherein the backlight source is configured to emit light with the LEDs, and an LCD-panel, which is configured to selectively transmit and/or modulate light from the backlight source, in order to display the fireplace video, characterized in that, an edge of the LED pattern substantially corresponds to a flame top edge of a flame area in which the flames are imaged in the fireplace video.

Embodiment 2

Display device according to embodiment 1, the entire LED pattern substantially corresponds to the flame area.

Embodiment 3

Display device according to embodiment 1 or 2, further comprising a reflector panel, which is located adjacent to the backlight source and which comprises a surface with a high reflectivity, which is configured to reflect light.

Embodiment 4

Display device according to embodiment 3, wherein the high-reflective surface of the reflector panel comprises a high-reflective coating, for example a white coating.

Embodiment 5

Display device according to embodiment 3 or 4, wherein the high-reflective surface of the reflector panel only spans across a portion of the panel, having a high-reflective surface area that substantially corresponds to the flame area.

Embodiment 6

Display device according to embodiment 5, wherein the high-reflective surface area substantially corresponds to the LED pattern.

Embodiment 7

Display device according to embodiment 6, wherein a remaining portion of the reflector panel, e.g. outside the high-reflective surface area, comprises a surface with a low reflectivity that is configured to absorb light.

Embodiment 8

Display device according to embodiment 7, wherein the low-reflective surface of the reflector panel comprises a low-reflective coating, for example a black coating.

Embodiment 9

Display device according to embodiment 7 or 8, wherein the reflector panel comprises a transitional reflective surface with a high reflectivity in between the high-reflective surface area and the low-reflective surface area, wherein the transitional reflective surface is configured to reflect light.

Embodiment 10

Display device according to embodiment 9, wherein the transitional reflective surface of the reflector panel comprises a high-reflective coating, for example a white coating.

Embodiment 11

Display device according to any of the preceding embodiments, further comprising a mask, which is located in between the backlight source and the LCD-panel and which comprises an absorbing mask surface that is configured to absorb light,
wherein the mask further comprises a mask aperture in the mask surface, which has a shape that substantially corresponds to the flame area.

Embodiment 12

Display device according to embodiment 11, wherein the absorbing mask surface comprises an absorbing coating, for example a black coating.

Embodiment 13

Display device according to embodiment 11 or 12, wherein the mask comprises a transitional mask surface outside the mask aperture, which is configured to reflect light and which has a gradual change in reflectivity from the mask aperture towards the absorbing mask surface.

Embodiment 14

Display device according to embodiment 13, wherein the transitional mask surface has a gradual change in colour, for example gradually changing from white to black.

Embodiment 15

Artificial fireplace for displaying an artificial fire pattern, which comprises a display device according to any of the preceding embodiments.

Embodiment 16

Artificial fireplace according to embodiment 15, further comprising:
a housing, defining an interior and comprising at least one opening to allow a line of sight into the interior of the housing,
a semi-transparent mirror, which is arranged in the interior of the housing and which comprises:
a first side, facing the opening, and
an opposite second side, facing away from the opening, and
a fireplace background, which is arranged in the housing, wherein the display device is arranged in the housing and configured to display a first fireplace video,
wherein the semi-transparent mirror is arranged to at least partially reflect the first fireplace video at its first side and to at least partially transmit an image of the fireplace background at its second side, in order to recombine the first fireplace video and the background image into the artificial fire pattern, such that the artificial fire pattern is visible along the line of sight.

Embodiment 17

Method for displaying a fireplace video with a display device, comprising the steps of:
providing a fireplace video, which at least comprises flames that are imaged within a flame area,
emitting light with a backlight source of the display device,
illuminating an LCD-panel with the light,
selectively transmitting and/or modulating the light with the LCD-panel to display the fireplace video,
characterized in that,
the backlight source comprises a plurality of LEDs for the emitting of the light, which are disposed in an LED pattern, wherein an edge of the LED pattern substantially corresponds to a flame top edge of the flame area in which the flames are imaged in the fireplace video.

The invention claimed is:

1. Artificial fireplace for displaying an artificial fire pattern, which comprises:
   a fireplace video having a flame area in which flames are imaged, and
   a display device, configured to display the fireplace video, wherein the display device comprises:
   a backlight source, which comprises a plurality of LEDs, which are disposed in an LED pattern, wherein the backlight source is configured to emit light with the LEDs, and
   an LCD-panel, which is configured to selectively transmit and/or modulate light from the backlight source, in order to display the fireplace video,
   characterized in that,
   the LED pattern is adapted to the flames that are displayed, in order to only emit backlight onto the LCD-panel where the flames are to be displayed, such that an edge of the LED pattern substantially corresponds to a flame top edge of the flame area.

2. Artificial fireplace according to claim 1, wherein the display device is configured to display the fireplace video in a rectangular display area of the device,
wherein the LED pattern spans part of the rectangular display area, and
wherein a remaining part of the rectangular display area, e.g. outside the part spanned by the LED pattern, is free of LEDs.

3. Artificial fireplace according to claim 2, wherein the edge of the LED pattern is offset from a neighbouring rectilinear edge of the rectangular display area.

4. Artificial fireplace according to claim 3, wherein a top edge of the LED pattern is a non-rectilinear top edge that is offset from a rectilinear top edge of the top edge of the rectangular display area.

5. Artificial fireplace according to claim 4, wherein the top edge of the LED pattern substantially corresponds to a flame top edge, e.g. a non-rectilinear flame top edge of the flame area.

6. Artificial fireplace according to claim 2, wherein all edges of the LED pattern are offset from respective neighbouring rectilinear linear edges of the rectangular display area.

7. Artificial fireplace according to claim 6, wherein all edges of the LED pattern are non-rectilinear edges that substantially correspond to all respective flame edges of the flame area.

8. Artificial fireplace according to claim 1, wherein a bottom edge of the LED pattern has an arc shape, e.g. to correspond to a bottom edge shape of the flame area.

9. Artificial fireplace according to claim 1, further comprising a reflector panel, which is located adjacent to the backlight source and which comprises a surface with a high reflectivity, which is configured to reflect light.

10. Artificial fireplace according to claim 9, wherein the high-reflective surface of the reflector panel comprises a high-reflective coating, for example a white coating.

11. Artificial fireplace according to claim 9, wherein the high-reflective surface of the reflector panel only spans across a portion of the panel, having a high-reflective surface area that substantially corresponds to the flame area.

12. Artificial fireplace according to claim 11, wherein the high-reflective surface area substantially corresponds to the LED pattern.

13. Artificial fireplace according to claim 12, wherein a remaining portion of the reflector panel, e.g. outside the high-reflective surface area, comprises a surface with a low reflectivity that is configured to absorb light.

14. Artificial fireplace according to claim 13, wherein the low-reflective surface of the reflector panel comprises a low-reflective coating, for example a black coating.

15. Artificial fireplace according to claim 13, wherein the reflector panel comprises a transitional reflective surface with a high reflectivity in between the high-reflective surface and the low-reflective surface, wherein the transitional reflective surface is configured to reflect light.

16. Artificial fireplace according to claim 15, wherein the transitional reflective surface of the reflector panel comprises a high-reflective coating, for example a white coating.

17. Artificial fireplace according to claim 1, further comprising a mask, which is located in between the backlight source and the LCD-panel and which comprises an absorbing mask surface that is configured to absorb light, wherein the mask further comprises a mask aperture in the absorbing mask surface, which has a shape that substantially corresponds to the flame area.

18. Artificial fireplace according to claim 17, wherein the absorbing mask surface comprises an absorbing coating, for example a black coating.

19. Artificial fireplace according to claim 17, wherein the mask comprises a transitional mask surface outside the mask aperture, which is configured to reflect light and which has a gradual change in reflectivity from the mask aperture towards the absorbing mask surface.

20. Artificial fireplace according to claim 19, wherein the transitional mask surface has a gradual change in colour, for example gradually changing from white to black.

21. Artificial fireplace according to claim 1, further comprising:
a housing, defining an interior and comprising at least one opening to allow a line of sight into the interior of the housing,
a semi-transparent mirror, which is arranged in the interior of the housing and which comprises:
a first side, facing the opening, and
an opposite second side, facing away from the opening, and
a fireplace background, which is arranged in the housing, wherein the display device is arranged in the housing and configured to display a first fireplace video,
wherein the semi-transparent mirror is arranged to at least partially reflect the first fireplace video at its first side and to at least partially transmit an image of the fireplace background at its second side, in order to recombine the first fireplace video and the background image into the artificial fire pattern, such that the artificial fire pattern is visible along the line of sight.

22. Method for displaying a fireplace video with an artificial fireplace that comprises a display device, comprising the steps of:
providing a fireplace video, which at least comprises flames that are imaged within a flame area,
emitting light with a backlight source of the display device,
illuminating an LCD-panel with the light,
selectively transmitting and/or modulating the light with the LCD-panel to display the fireplace video,
characterized in that,
the backlight source comprises a plurality of LEDs for the emitting of the light, which are disposed in an LED pattern, wherein the LED pattern is adapted to the flames that are displayed, in order to only emit backlight onto the LCD-panel where the flames are to be displayed, such that an edge of the LED pattern substantially corresponds to a flame top edge of the flame area.

* * * * *